United States Patent
Hayase

(10) Patent No.: US 10,893,610 B2
(45) Date of Patent: Jan. 12, 2021

(54) SWITCHING DEVICE DRIVING UNIT

(71) Applicant: Mitsubishi Electric Corporation, Tokyo (JP)

(72) Inventor: Kei Hayase, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 0 days.

(21) Appl. No.: 16/489,010

(22) PCT Filed: Apr. 3, 2017

(86) PCT No.: PCT/JP2017/013909
§ 371 (c)(1),
(2) Date: Aug. 27, 2019

(87) PCT Pub. No.: WO2018/185805
PCT Pub. Date: Oct. 11, 2018

(65) Prior Publication Data
US 2020/0068713 A1     Feb. 27, 2020

(51) Int. Cl.
*H05K 1/18* (2006.01)
*H01L 23/36* (2006.01)
(Continued)

(52) U.S. Cl.
CPC ......... *H05K 1/181* (2013.01); *H01L 23/3675* (2013.01); *H01L 25/18* (2013.01);
(Continued)

(58) Field of Classification Search
CPC . H01L 25/18; H01L 29/2003; H01L 23/3675; H01L 23/3677; H01L 23/4006;
(Continued)

(56) References Cited

U.S. PATENT DOCUMENTS

2002/0141161 A1\* 10/2002 Matsukura ............. H01L 23/42
361/713
2006/0044762 A1\* 3/2006 Kikuchi ................ H01L 25/162
361/704
(Continued)

FOREIGN PATENT DOCUMENTS

JP     2002-050722 A    2/2002
JP      2002-50722 A    2/2002
(Continued)

OTHER PUBLICATIONS

International Search Report of PCT/JP2017/013909 dated May 16, 2017.
(Continued)

*Primary Examiner* — Adam B Dravininkas
(74) *Attorney, Agent, or Firm* — Sughrue Mion, PLLC; Richard C. Turner

(57) ABSTRACT

To provide a switching device driving unit that can shorten a connecting distance between a driver and a semiconductor switching element, while ensuring the insulation between a driver and a cooling device, even in a case of employing a semiconductor switching element which is composed of wide gap semiconductor. The switching device driving unit includes a circuit board, a semiconductor switching element composed of wide band gap semiconductor, a cooling device and a driver. The driver is surface mounted on a second face, which is an opposite side face of a first face which is a face of the circuit board on a side where the cooling device is disposed.

12 Claims, 5 Drawing Sheets

(51) Int. Cl.
  *H01L 25/18* (2006.01)
  *H01L 23/367* (2006.01)
  *H05K 1/02* (2006.01)
  *H05K 1/11* (2006.01)
  *H05K 7/20* (2006.01)
  *H02M 7/00* (2006.01)

(52) U.S. Cl.
  CPC .......... *H05K 1/0203* (2013.01); *H05K 1/115* (2013.01); *H05K 7/209* (2013.01); *H02M 7/003* (2013.01); *H05K 2201/10166* (2013.01); *H05K 2201/10545* (2013.01)

(58) Field of Classification Search
  CPC ........ H01L 23/36; H01L 25/07; H02M 7/003; H05K 7/209; H05K 1/181; H05K 1/0203; H05K 1/115; H05K 2201/10166; H05K 2201/10545
  See application file for complete search history.

(56) References Cited

U.S. PATENT DOCUMENTS

| | | | |
|---|---|---|---|
| 2009/0140399 A1 | 6/2009 | Schulz et al. | |
| 2012/0188712 A1* | 7/2012 | Ishibashi | H02M 7/003 361/688 |
| 2013/0033914 A1* | 2/2013 | Yahata | H02M 7/48 363/132 |
| 2013/0077255 A1* | 3/2013 | Abe | H01L 23/36 361/716 |
| 2014/0063747 A1* | 3/2014 | Sotome | H05K 7/209 361/720 |
| 2015/0208556 A1 | 7/2015 | Kodama et al. | |
| 2015/0319840 A1 | 11/2015 | Sanada et al. | |

FOREIGN PATENT DOCUMENTS

| | | |
|---|---|---|
| JP | 2013-219227 A | 10/2013 |
| JP | 5535292 B2 | 7/2014 |
| JP | 5823020 B2 | 11/2015 |
| JP | 2017-033959 A | 2/2017 |
| JP | 2017-037951 A | 2/2017 |

OTHER PUBLICATIONS

Communication dated Mar. 5, 2020 by the European Patent Office in application No. 17904722.0.
Communication dated Apr. 7, 2020 by the Japanese Patent Office in application No. 2019-510505.

* cited by examiner

SWITCHING DEVICE DRIVING UNIT

CROSS REFERENCE TO RELATED APPLICATIONS

This application is a National Stage of International Application No. PCT/JP2017/013909 filed Apr. 3, 2017.

TECHNICAL FIELD

The present disclosure relates to a switching device driving unit, which is provided with a semiconductor switching element that is composed of wideband gap semiconductor, and a driver that drives the semiconductor switching element, and more particularly relates to the arrangement of the driver.

BACKGROUND ART

In relevance to the electric power converter which is provided with a semiconductor switching element and a driver, structures for mounting electrical components, such as a transformer and a reactor, and semiconductor switching elements onto a case with sufficient cooling efficiency have been proposed for reducing the size of the electric power converter. For example, a method is known where an electric power converter has a concave portion for storing an electrical component which is comparatively tall in height, and in addition, is provided with a storage body which has a refrigerant flow passage on a side face portion of the concave portion, and a semiconductor switching element with comparatively low height, is mounted on a top face of the side face portion, and a circuit board is mounted on the upper surface of the electrical component or the semiconductor switching element (JP 5823020 B, JP 5535292 B).

In the above mentioned structures, high space utilization and high density packaging can be realized for electrical components and semiconductor switching elements which have variety in height, because respective parts are arranged uniformly in height onto a circuit board, and then, dead space can be decreased, while the cooling efficiency of the electrical components is increased. Further, because electrical components, semiconductor switching elements and the like are disposed under the circuit board, a small projected area can be provided in the electric power converter.

CITATION LIST

Patent Literature

Patent Document 1: JP 5823020 B
Patent Document 2: JP 5535292 B

SUMMARY OF INVENTION

Technical Problem

However, when GaN (Gallium Nitride), SiC (Silicon Carbide), and the like, which have a wide band gap and are capable of high speed operations, are used as in a semiconductor switching element, the connecting distance between the semiconductor switching element and the driver which is surface mounted on the circuit board, needs to be made smaller, for securing the stability in the high speed operations. When a short connecting distance is required between the semiconductor switching element and the driver, a lead which connects the semiconductor switching element and the circuit board needs to be made short. On that account, a cooling surface of the semiconductor switching element needs to be put closer to the circuit board, and a cooling device which cools the cooling surface needs to be put closer to the circuit board. On the other hand, in order to provide enough insulation between the driver and the case (the cooling device), the driver is in need to be disposed in a position where an insulation distance from the cooing device is secured. For this purpose, it is necessary to dispose a driver in a region other than a projection area where the cooling device is projected on the circuit board face on the side where the cooling device is disposed. As a result, the semiconductor switching element and the driver need to employ a long connecting distance, and then, the stable operation of the semiconductor switching element has become difficult to achieve.

Further, for the stable operation of the semiconductor switching element which is constructed with wideband gap semiconductor, surface mounted packages, which include no leads in a semiconductor package, are also increasing in number. Furthermore, thinning of the semiconductor switching element is in progress for reducing its size. A cooling device, for cooling a slimmed semiconductor switching element which is surface mounted in this way, is disposed at a location near the circuit board. In order to secure the insulation distance between the cooling device and the driver, it is necessary to dispose the driver in an area other than a projection area where the cooling device is projected on the circuit board face on the side where the cooling device is disposed. Consequently, a long connecting distance must be provided between the semiconductor switching element and the driver, and the stable operation of the semiconductor switching element has become difficult to attain.

Moreover, the wideband gap semiconductor has a feature in that a smaller chip, compared with Si (Silicon) semiconductor, can be manufactured, and reduction in the package size can be attained. As a result, the semiconductor switching element has become small in size with respect to the cooling device, and the connecting distance with the semiconductor switching element has become long in order to secure a sufficient insulation distance with the cooling device.

Then, it is desired to provide a switching device driving unit that can shorten a connecting distance between a driver and a semiconductor switching element, while securing an electrical insulation between the driver and the cooling device, even in a case of employing the semiconductor switching element which is composed of wideband gap semiconductor.

Solution to Problem

A switching device driving unit, according to the present disclosure, includes:
a circuit board which has a circuit pattern;
a semiconductor switching element which is connected with the circuit board and is composed of wideband gap semiconductor;
a cooling device which coos the semiconductor switching element, keeping an electrically insulated state with the semiconductor switching element; and
a driver which drives the semiconductor switching element, wherein the driver is surface mounted on a second face, which is an opposite side face of a first face which is a face of the circuit board on the side where the cooling device is disposed.

Advantage of Invention

According to the switching device driving unit with relevance to the present disclosure, s necessary to insulate a cooling device electrically from a part of the driver which is electrically conductive with a semiconductor switching element, because the semiconductor switching element is electrically insulated from the cooing device. The driver, which drives a semiconductor switching element composed of the wideband gap semiconductor, is surface mounted on the second face, which is an opposite side face of a first face which is a face of the circuit board on the side where the cooling device is disposed. Accordingly, the circuit board can be disposed between the driver and the cooling device, and then, it becomes possible to provide a sufficient insulation between the driver and the cooling device. Further, because the driver is disposed on an opposite side of the cooling device, with the circuit board placing between the cooling device and the driver, the locating position of the driver can be determined, independent of the locating position of the cooling device. For these reasons, it becomes possible to dispose a driver near the semiconductor switching element, and to provide a short connecting distance between the driver and the semiconductor switching element. Then, it is possible to secure stability to high speed operation.

DESCRIPTION OF EMBODIMENTS

Embodiment 1

Figure 1:
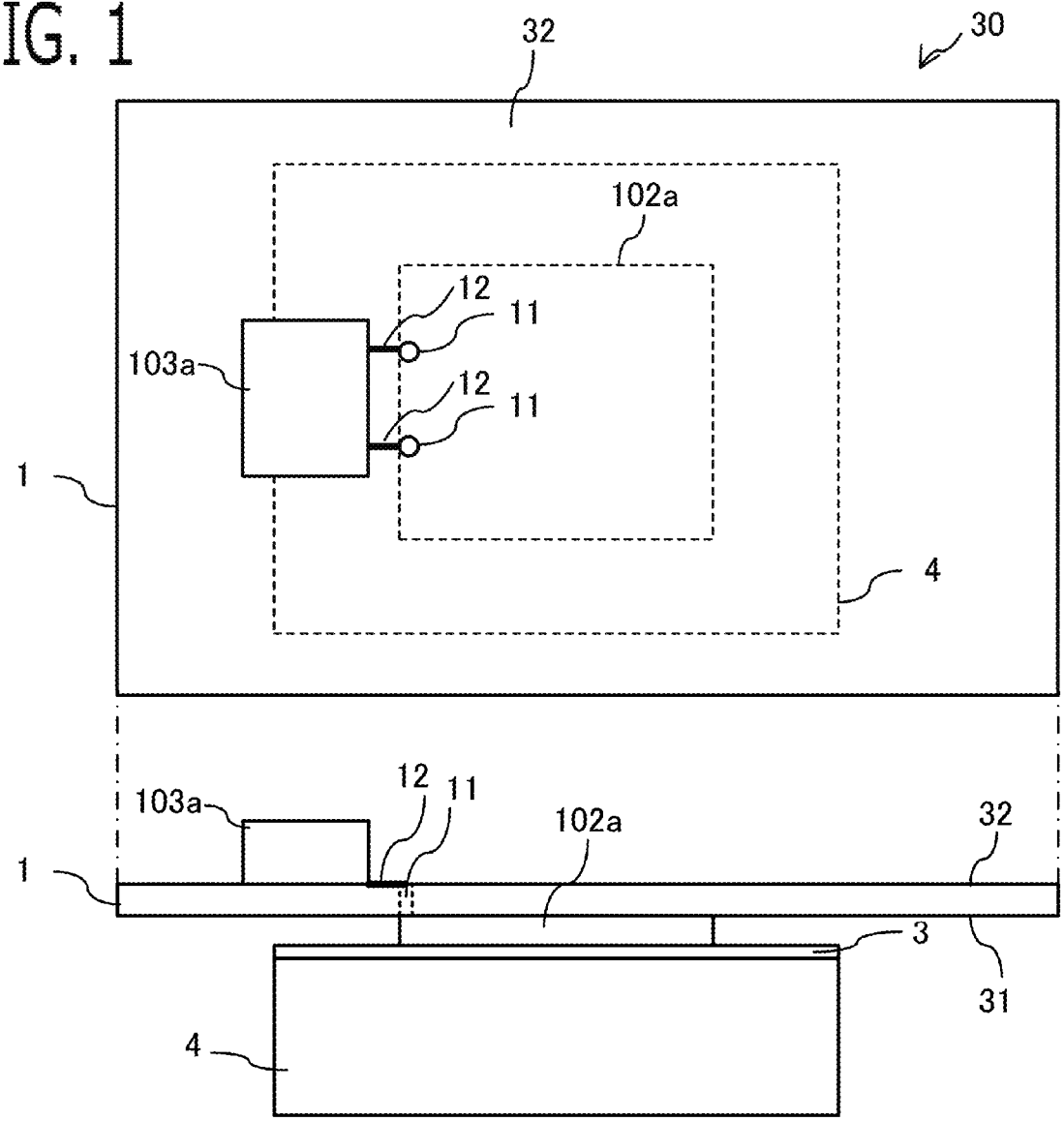
FIG. 1 is a top view and a side view of a switching device driving unit in accordance with Embodiment 1 of the present disclosure.

Explanation will be made, with reference to drawings, about a switching device driving unit 30 in accordance with Embodiment 1. The upper side illustration in FIG. 1 is a top view of the switching device driving unit 30 according to Embodiment 1, which is viewed from a second face 32 side of the circuit board 1, and the lower side illustration in FIG. 1 is a side view of the switching device driving unit 30, which is viewed from the side thereof, FIG. 2 is a circuit diagram of an electric power converter which is equipped with four switching device driving units 30.

Figure 2:
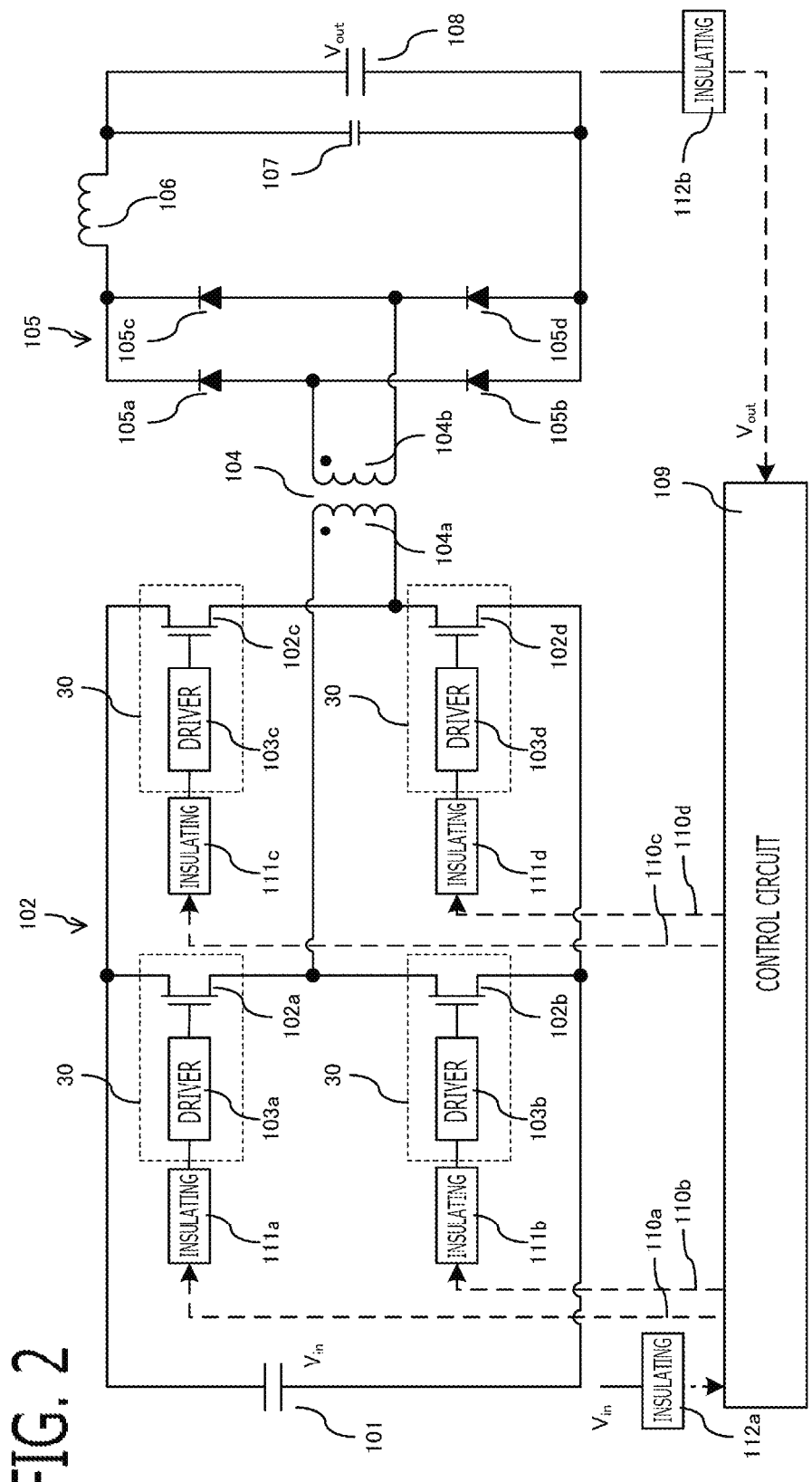
FIG. 2 is a circuit diagram of an electric power converter, which is constructed with a plurality of switching device driving units, in accordance with Embodiment 1 of the present disclosure.

The electric power converter, which is shown in FIG. 2, is an example of the electric power converter provided with switching device driving units 30, and is an insulated type full bridge DC—DC converter. The electric power converter is provided with an insulated transformer 104, a single phase inverter 102 which is connected to the primary winding wire 104a of the transformer 104, and a rectifier circuit 105 which is connected to the secondary winding wire 104b of the transformer 104.

The single phase inverter 102 is provided with four semiconductor switching elements 102a to 102d, which are constructed in a full bridge. Each of the semiconductor switching elements 102a to 102d employs a FET (Field Effect Transistor), and is composed of GaN (Gallium Nitride), a wideband gap semiconductor, which has reverse electrical connection characteristics in a source to drain direction. The single phase inverter 102 converts direct current voltage Vin of the input power source 101 into alternating voltage, and supplies it to the primary winding wire 104a of the transformer 104. Each of the semiconductor witching elements may be provided with a diode, which is connected in inverse parallel between the source and the drain, and the diode may be constructed with wideband gap semiconductor. Further, each of the semiconductor switching elements may employ a MOSFET (Metal Oxide Semiconductor Field Effect Transistor), an IGBT (Insulated Gate Bipolar Transistor), and the like, which are composed of wideband gap semiconductor. SiC (Silicon Carbide), diamond based material, and the like may be used as wideband gap semicondutctor.

The rectifier circuit 105 is provided with diodes 105a to 105d as four rectifier elements (semiconductor devices), which are constructed in a full bridge. Further, the output of the rectifier circuit 105 is connected to a reactor 106 and an output capacitor 107, which are used for smoothing the output, and the smoothed direct current voltage Vout is outputted to the load 108.

In addtion, the electric power converter is provided with a control circuit 109, which controls semiconductor switching elements. The control circuit 109 is electrically insulated from a main circuit of the single phase inverter 102 and the like. The control circuit 109 receives a detection signal of the input voltage Vin, which is inputted via the insulating element 112a, and a detection signal of the output voltage Vout, which is inputted via the insulating element 112b. The control circuit 109 generates gate signals 110a to 110d which turn on and off semiconductor switching elements 102a to 102d respectively, so that the output voltage Vout becomes a target voltage, and controls an ON Duty (an ON period) in each of the semiconductor switching elements 102a to 102d. Here, each of the gate signals 110a to 110d is inputted respectively into the drivers 103a to 103d via the insulating elements 111a to 111d. The insulating elements 111a to 111d employ a photo coupler, a magnetic coupler, or the like. Each of the drivers 103a to 103d is provided with a semiconductor switching element, like a FET. Each of the semiconductor switching elements generates a gate driving signal in response to each of the gate signals 110a to 110d, and respective gate driving signals is inputted into the respective gate terminals of the semiconductor switching elements 102a to 102d.

Next, explanation will be made about the switching device driving unit 30. FIG. 1 shows a mounting structure of the switching device driving unit 30, which is provided with a pair of semiconductor switching element and driver, from among four pairs of semiconductor switching elements 102a to 102d and drivers 103a to 103d. For an exemplary purpose, FIG. 1 shows the semiconductor switching element 102a and the driver 103a.

The switching device driving unit 30 is provided with a circuit board 1 which has circuit patterns. In the present embodiment, the circuit board 1 includes circuit patterns which are printed on the base material of glass epoxy and the like. The circuit board 1 has a plurality of layered circuit patterns, of equal to or greater than two layers. The circuit board 1 is flat plate like, and is provided with a first face 31, which is one side face, and a second face 32, which is the other side face. Although FIG. 1 shows an exemplary case in which one switching device driving unit 30 is provided with one circuit board 1, a plurality of switching device driving units 30 may be provided on one common circuit board 1.

The semiconductor switching element 102a is a surface mounting type, and is a chip of plate like shape (in the present embodiment, of rectangular plate shape). The one side face of the semiconductor switching element 102a is a surface mounting face, and contact terminal pads, which is solder joined with a circuit pattern of the circuit board 1, are provided thereon in the present embodiment, there are provided with contact terminal pads of a gate terminal, a source terminal, and a drain terminal. The other side face of the semiconductor switching element 102a is a cooling surface, and cooling pads are provided thereon.

The surface mounting face of the semiconductor switching element 102a is surface mounted to the first face 31 of the circuit board 1, and the gate terminal, the source terminal, and the drain terminal of the semiconductor switching element 102a are connected to a circuit pattern of the circuit board 1. On the cooling surface of the semiconductor switching element 102a, a cooing device 4 is attached. Accordingly, the heat of the semiconductor switching element 102a is transferred to the cooling device 4, without passing through the circuit board 1. On this account, efficiency in the heat transfer from the semiconductor switching element 102a to the cooling device 4 can be improved.

In the present embodiment, an insulation sheet 3 is inserted, as an insulating member, between the cooling surface of the semiconductor switching element 102a and the mounting surface of the cooling device 4. Even if the cooling device 4 has electrical conduction with the case of the electric power converter because of heat transfer and the like, it is possible to provide a sufficient electrical insulation between the case and the semiconductor switching element 102a. The insulation sheet 3 is pasted up on the overall area of the mounting surface of the cooling device 4. Arrangement of the insulation sheet 3 makes it possible to secure the electrical insulation between the cooling device 4 and the circuit board 1, and to secure the insulation distance between the cooling device 4 and the driver 103a which is disposed on the opposite side of the circuit board 1.

In a case where the cooling surface of the semiconductor switching element 102a is insulated, the insulation sheet 3 may not be inserted. Further, heat spreader, which diffuses the heat of the semiconductor switching element 102a, may be provided between the semiconductor switching element 102a and the insulation sheet 3. The cooling device 4 may employ a water cooling type which has a water passage, and also may employ an air cooling type which is provided with cooling fins and performs cooling with the air. In the present embodiment, the cooling device 4 has an outer shape of rectangular parallelepiped like.

Because the semiconductor switching element 102a is composed of wideband gap semiconductor, the downsizing in the semiconductor switching element is attained, compared with a case where the conventional Si (Silicon) semiconductor is employed. On this account, the cooling surface of the semiconductor switching element 102a is smaller than the mounting surface of the cooling device 4, and the semiconductor switching element 102a is covered by the cooling device 4. The cooling surface of the semiconductor switching element 102a is attached at the central part of the mounting surface of the cooling device 4. Thereby, improvement can be attained in the diffusion of heat which is transferred to the cooling device 4 from the semiconductor switching element 102a.

Between the first face 31 of the circuit board 1 and the mounting surface of the cooling device 4, a space where no semiconductor switching element 102a is disposed is produced. If the driver 103a can be disposed in the space, it is possible to provide a short connecting distance between the driver 103a and the semiconductor switching element 102a. However, since the semiconductor switching element 102a is slimmed down by the use of the wideband gap semiconductor, the interval of the space has become narrower. On this account, it has become hard to dispose the driver 103a in a space between the circuit board 1 and the cooling device 4, while keeping a sufficient insulation distance with the cooling device 4.

Thereby, the driver 103a is surface mounted on the second face 32, which is an opposite side face of the first face 31 which is a face of the circuit board 1 on the side where the cooling device is disposed.

According to the above mentioned configuration, the circuit board 1 is disposed between the driver 103a and the cooling device 4, and then, it is possible to keep a sufficient insulation between the driver 103a and the cooling device 4. Further, the driver 103a is disposed on the opposite side of the cooling device 4 interposing the circuit board 1. Accordingly, the locating position of the driver 103a can be determined, independent, of the locating position of the cooling device 4. For this reason, it becomes possible to dispose the driver 103a near the semiconductor switching element 102a, and to provide a short connecting distance between the driver 103a and the semiconductor switching element 102a. Then, it is possible to secure stability to high speed operation.

In the present embodiment, the driver 103a is an active element that is disposed at a location nearest to the semiconductor switching element 102a which is driven by the driver 103a. Here, the active element is among devices which are respective parts used as the members in an electronic circuit and have independent and inherent functions, and is a device which is capable of converting energy other than a signal into a signal energy, and amplifying it, such as a transistor (a semiconductor switching element). Passive elements, such as a resistance, a coil, and a capacitor, and wiring are removed from the active element. It is to be noted that, as mentioned above, the driver 103a, which is provided with a semiconductor switching element, is an active element.

According to the above mentioned constitution, the driver 103a is disposed at a location nearest to the semiconductor switching element 102a, and the driver 103a and the semiconductor switching element 102a can have a short connecting distance. Then, it is possible to secure stability to high speed operation.

The driver 103a is disposed so that at least its portion overlaps with the cooling device 4, when viewed in normal directions of the first face 31 and the second face 32 of the circuit board 1. According to these configurations, the driver 103a can be disposed near the semiconductor switching element 102a up to a location where the driver 103a overlaps with the cooling device 4, when viewed in a normal direction. Further, it is possible to compactly arrange respective components of the switching device driving unit 30, and to attain the downsizing of the switching device driving unit.

The driver 103a is disposed so as not to overlap with the semiconductor switching element 102a, when viewed in normal directions of the first face 31 and the second face 32 of the circuit board 1. In the present embodiment, the driver 103a is not surface mounted in a region of the second face 32, which is an opposite side region of a region of the first face 31 where the semiconductor switching element 102a is surface mounted. But, the driver 103a is surface mounted in a region of the second face 32 which is close to this opposite side region of the second face 32. By these configurations, mutual heat transmission between the semiconductor switching element 102a and the driver 103a can be made hard via the circuit board 1, and in addition, electrical insulation in other than connection parts can be secured.

The interval between the driver 103a and the semiconductor switching element 102a is smaller than the width of the driver 103a and the width of the semiconductor switching element 102a, when viewed in a normal direction of the circuit board 1.

The semiconductor switching element 102a and the driver 103a are connected via through holes 11 which penetrate the circuit board 1. The through holes 11 are provided at a driver 103a side end portion of a region of the circut board 1 where the semiconductor switching element 102a is surface mounted. The through holes 11 are embedded with conductors. The first face 31 side of the through hole 11 is connected to the gate terminal and the like, which are provided in a surface mounting face of the semiconductor switching element 102a. The second face 32 side of the through hole 11 is connected to a terminal of the driver 103a via the connection pattern 12 which is provided in the second face 32. The driver 103a is an active element that has the shortest connecting distance with the semiconductor switching element 102a.

In the present embodiment, in addition to the gate terminal of the semiconductor switching element 102a, the source terminal is connected with the driver 103a, and the two through holes 11 and the two connection patterns 12 are provided.

Embodiment 2

Figure 3:
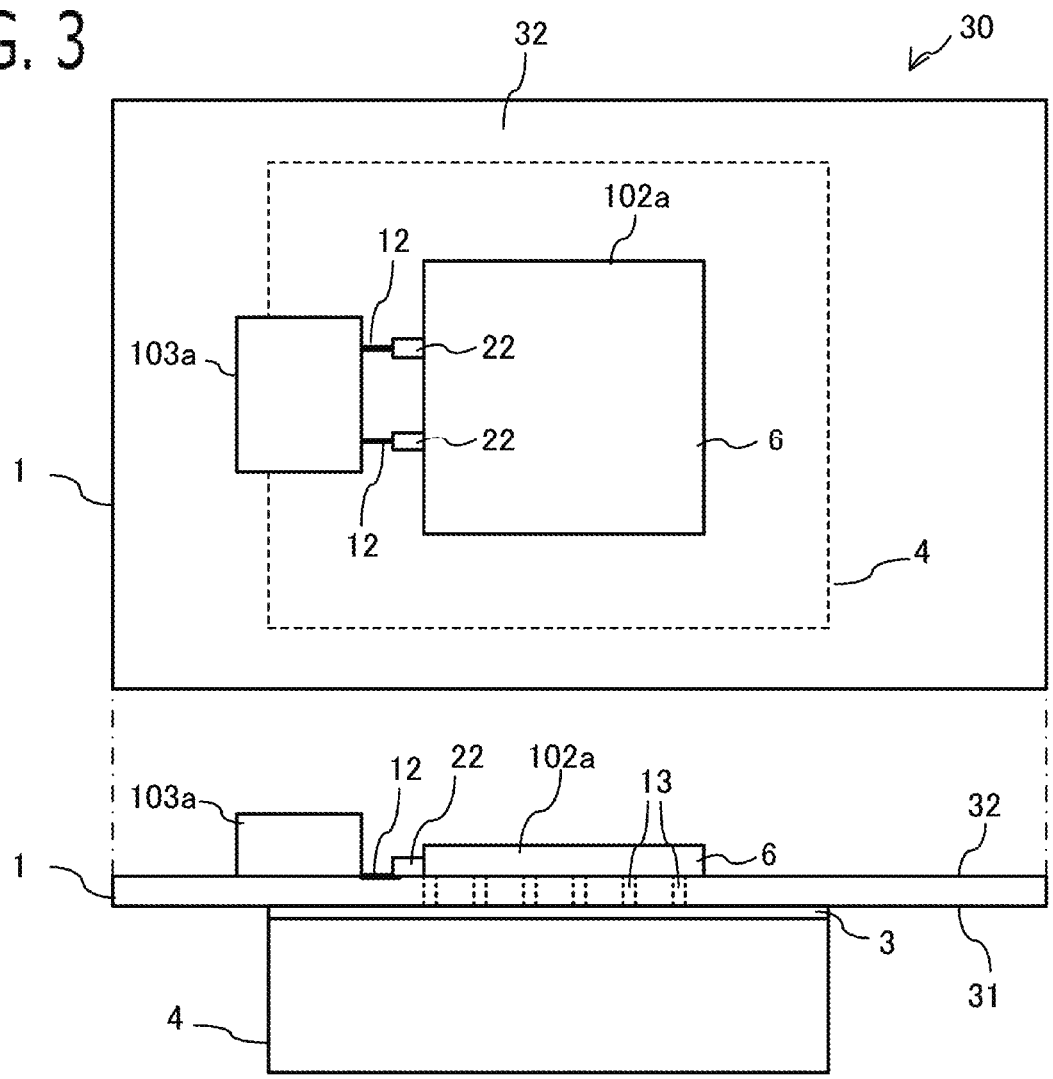
FIG. 3 is a top view and a side view of a switching device driving unit, in accordance with. Embodiment 2 of the present invention.

Next, explanation is made about a switching device driving unit 30 in accordance with Embodiment 2. The description of constituent parts which are identical to or similar with those in Embodiment 1 is omitted. Although basic configurations of the electric power converter and the switching device driving unit 30 according to the present embodiment are the same with those of Embodiment 1, the arrangement configuration of the switching device driving unit 30 differs from that in Embodiment 1. The upper side illustration in FIG. 3 is a top view of the switching device driving unit 30 according to Embodiment 2, which is viewed from the second face 32 side of the circuit board 1, and the lower side illustration in FIG. 3 is a side view of the switching device driving unit 30, which is viewed from the side thereof.

Also in the present embodiment, like in the case of Embodiment 1, the driver 103a is surface mounted on the second face 32, which is an opposite side face of the first face 31 which is a face of the circuit board 1, on the side where the cooling device 4 is disposed. Further, the driver 103a is an active element that is disposed at a location nearest to the semiconductor switching element 102a which is driven by the driver 103a. Furthermore, the driver 103a is an active element that has the shortest connecting distance with the semiconductor switching element 102a.

In the present embodiment, unlike in the case of Embodiment 1, the semiconductor switching element 102a is surface mounted to the second face 32. The semiconductor switching element 102a has a cooling pad on a face, which is surface mounted to the circuit board 1. Then, the cooling device 4 is attached to a region of the first face 31, which is an opposite side region of a region of the second face 32 where the semiconductor switching element 102a is surface mounted. And further, heat of the semiconductor switching element 102a is transferred to the cooling device 4 via the circuit board 1.

According to the above mentioned constitution, it is possible to cool the heat of the semiconductor switching element 102a, by transferring the heat via the circuit board 1 to the opposite side cooling device 4. The physical interference between the cooling device 4 and the driver 103a is avoided; the driver 103a is disposed right next to the semiconductor switching element 102a; and the connecting distance can be minimized. The semiconductor switching element 102a and the driver 103a can be connected, without passing through the through hole 11 like in Embodiment 1. And, it is possible to suppress the structure of the circuit board from being complicated.

A center portion of the mounting surface of the cooing device 4 is disposed on the opposite side of the semiconductor switching element 102a interposing the circuit board 1. Between the cooling device 4 and the first face 31, an insulation sheet 3 as an insulating member is inserted. The through holes 13, which penetrate the circuit board 1, are provided in a region of the circuit board 1 where a cooling pad of the semiconductor switching element 102a is disposed. The through holes 13 are filled up with heat conducting material such as resin and metal. Accordingly, heat of the semiconductor switching element 102a can be efficiently transferred to the cooling device 4 by the through holes 13.

Since it is possible to secure the electrical insulation between the driver 103a and the cooling device 4 by the circuit board 1, the driver 103a is attached to a region of the second face 32, which is an opposite side region of a region of the first face 31 where the cooling device 4 is attached. Accordingly, driver 103a is disposed so that at least its portion overlaps with the cooling device 4, when viewed in the normal directions of the first face 31 and the second face 32 of the circuit board 1.

The interval between the driver 103a and the semiconductor switching element 102a which are surface mounted to the second face 32 has become smaller than the width of the driver 103a and the width of the semiconductor switching element 102a. The semiconductor switching element 102a has contact terminals 22 of the gate terminal and the source terminal, which extend from a rectangular plate like main body portion 6 to the driver 103a side. The two contact terminals 22 of the semiconductor switching element 102a are connected to the terminals of the driver 103a via the two connection patterns 12 which are provided on the second face 32.

As mentioned above, also in the configuration where the semiconductor switching element 102a has the cooling surface on the same face as the surface mounting face, it is possible to provide a short connecting distance between the semiconductor switching element 102a and the driver 103a, and to realize a stable fast switching, while securing an electrical insulation between the driver 103a and the cooling device 4, without sacrificing the cooling performance in the semiconductor switching element 102a which is composed of wideband gap semiconductor.

Embodiment 3

Figure 4:
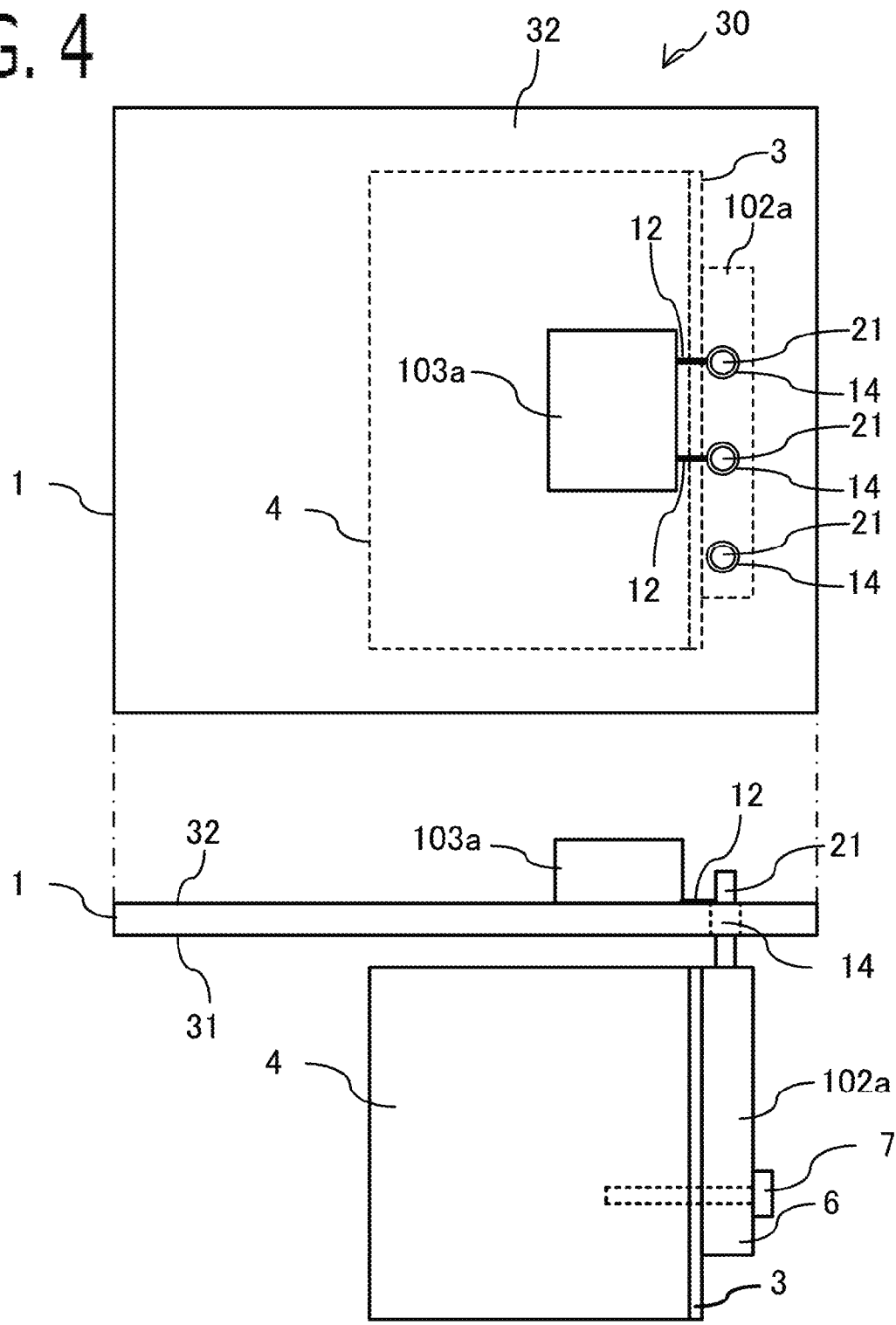
FIG. 4 is a top view and a side view of a switching device driving unit, in accordance with Embodiment 3 of the present disclosure.

Next, explanation is made about a switching device driving unit 30 in accordance with Embodiment 3. The description of constituent parts which are identical to or similar with those in Embodiment 1 is omitted. Although basic configurations of the electric power converter and the switching device driving unit 30 according to the present embodiment are the same with those of Embodiment 1, the arrangement configuration of the switching device driving unit 30 differs from that in Embodiment 1. The upper side illustration in FIG. 4 is a top view of a switching device driving unit 30 according to Embodiment 3 which is viewed from the second face 32 side of the circuit board 1, and the lower side illustration in FIG. 4 is a side view of the switching device driving unit 30 which is viewed from the side thereof.

Also in the present embodiment, like in the case of Embodiment 1, the driver 103a is surface mounted on the second face 32, which is an opposite side face of the first face 31 of the circuit board 1 on the side where the cooling device 4 is disposed. Further, the driver 103a is an active element that is disposed at a location nearest to the semiconductor switching element 102a which is driven by the driver 103a. Furthermore, the driver 103a is an active element that has the shortest connecting distance with the semiconductor switching element 102a.

In the present embodiment, unlike in the case of Embodiment 1, the semiconductor switching element 102a has a main body portion 6 of rectangular plate shape, and leads 21 which extend from a side face of the main body portion 6 in a straight line fashion. The lead 21 is inserted from the first face 31 side into a through hole 14 which penetrates the circuit board 1, and is attached to the circuit board 1 with solder paste and the like. At the first face 31 side of the circuit board 1, the main body portion 6 extends in the normal direction of the first face 31. The cooling device 4 is attached to one side face of the main body portion 6.

According to these configurations, since the main body portion 6 is disposed so as to extend in the normal direction of the first face 31, the main body portion 6 can be disposed apart from the first face 31, and the cooling device 4 can be attached to the cooling surface of one side of the main body portion 6. Accordingly, in the case where a packaged semiconductor switching element 102a with leads 21 is employed, the cooling device 4 can be disposed to the first face 31 side of the circuit board 1. The physical interference between the cooling device 4 and the driver 103a which is surface mounted to the second face 32 is avoided; the driver 103a is disposed very close to the leads 21 of the semiconductor switching element 102a which is attached to the circuit board 1; and the connecting distance between the driver 103a and the semiconductor switching element 102a can be shorten. Further, since the cool ng device 4 and the main body portion 6 can be disposed apart from the first face 31, it is possible to secure an electrical insulation between the cooling device 4 and the circuit board 1, and to secure an insulation distance between the cooling device 4, and the driver 103a which is disposed on the opposite side of the circuit board 1.

The mounting surface of the cooling device 4 is made larger than the cooling surface of the semiconductor switching element 102a. However, the mounting surface of the cooling device 4 is disposed close to away side from the first face 31, with respect to the cooling surface of the semiconductor switching element 102a. In other words, a portion of the mounting surface of the cooling device 4, which is not attached to the cooling surface of the semiconductor switching element 102a, is an away side part from the first face 31. Accordingly, the main body portion 6 can be placed closer to the first face 31, and a connecting distance between the semiconductor switching element 102a and the driver 103a can be shorten, while providing a sufficient space between the cooling device 4 and the first face 31.

Between the mounting surface of the cooling device 4 and the cooling surface of the semiconductor switching element 102a, an insulation sheet 3 is inserted as an insulating member. A screw 7 is inserted into a through hole which is provided in the main body portion 6, from the opposite side of the cooling device 4, and is screwed together with a female screw portion which is provided in the cooling device 4; then the cooling device 4 is fixed to the semiconductor switching element 102a.

In the present embodiment, three leads 21 of a gate terminal, a source terminal, and a drain terminal are provided, and three through holes 14 are also provided. The leads 21 of the gate terminal and the source terminal is connected to terminals of the driver 103a via two connection patterns 12 which are provided on the second face 32, respectively. The leads 21 of the source terminal and the drain terminal are connected to circuit patterns which are provided in the circuit board 1 and not shown in the drawing.

The driver 103a is disposed on the side where the cooling device 4 is disposed, with respect to an attaching portion of the lead 21 which is attached to the circuit board 1, and the driver 103a is disposed so that at least its portion overlaps with the cooling device 4, when viewed in the normal directions of the first face 31 and the second face 32 of the circuit board 1. It is possible to compactly arrange respective components of the switching device driving unit 30 and to reduce the size of the unit.

As mentioned above, the semiconductor switching element 102a is a package with leads 21. Even in the case where the semiconductor switching element employs a short lead 21 and needs to be surface mounted on the circuit board 1, a connecting distance between the semiconductor switching element 102a and the driver 103a can be shorten, and a stable fast switching can be realized, while securing an electrical insulation between the driver 103a and the cooling device 4, without sacrificing the cooling performance in the semiconductor switching element 102a which is composed of wideband gap semiconductor.

Embodiment 4

Figure 5:
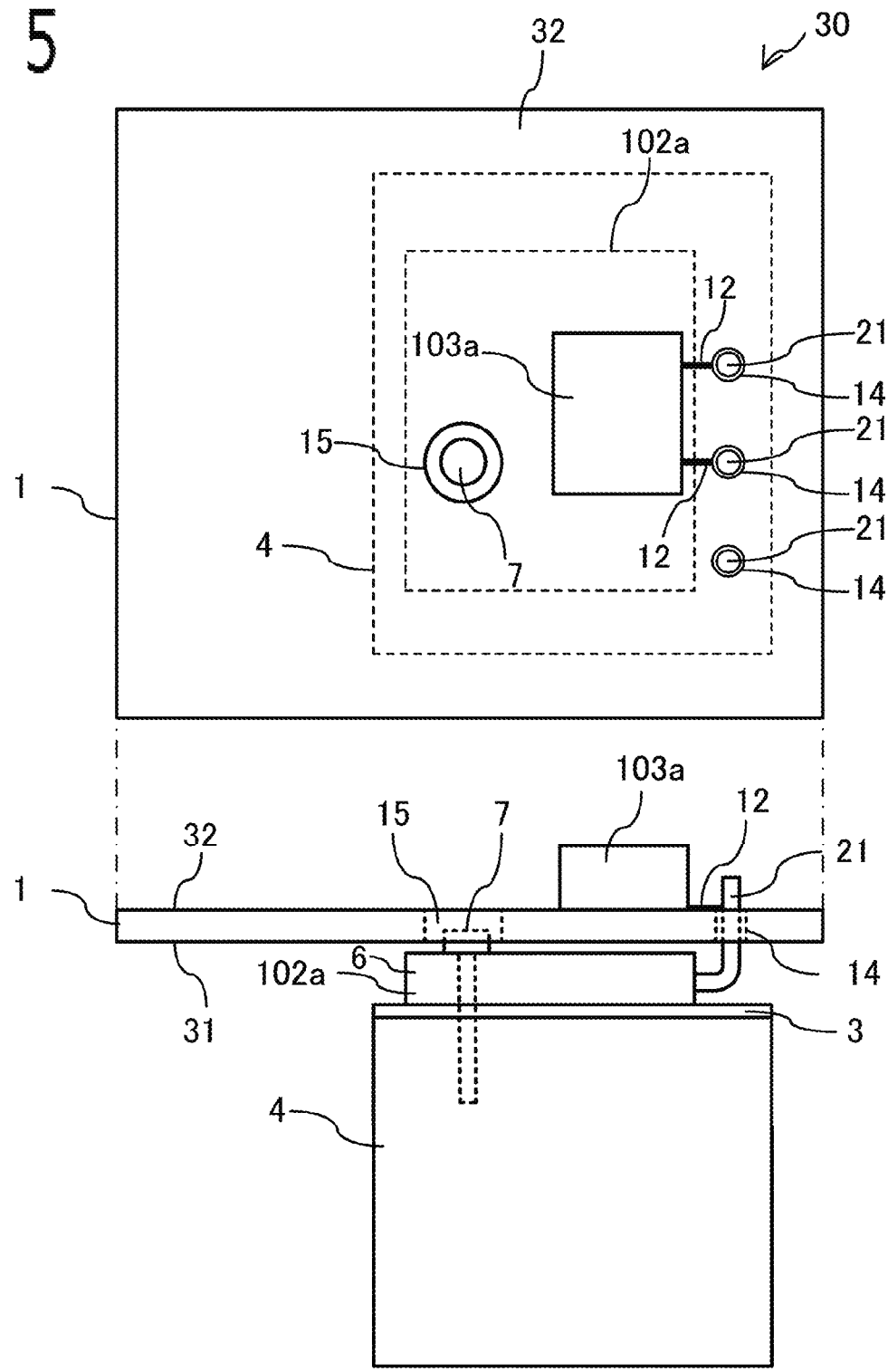
FIG. 5 is a top view and a side view of a switching device driving unit, in accordance with Embodiment 4 of the present disclosure.

Next, explanation is made about a switching device driving unit 30 in accordance with Embodiment 4. The description of constituent parts which are identical to or similar with those in Embodiment 1 is omitted. Although basic configurations of the electric power converter and the switching device driving unit 30 according to the present embodiment are the same with those of Embodiment 1, the arrangement configuration of the switching device driving unit 30 differs from that in Embodiment 1. The upper side illustration in FIG. 5 is a top view of a switching device driving unit 30 according to Embodiment 4, when viewed from the second face 32 side of the circuit board 1, and the lower side illustration in FIG. 5 is a side view of the switching device driving unit 30, when viewed from the side thereof.

Also in the present embodiment, like in the case of Embodiment 1, the driver 103a is surface mounted on the second face 32 of the circuit board 1, which is an opposite side face of the first face 31 of the circuit board 1 on the side where the cooling device 4 is disposed. Further, the driver 103a is an active element that is disposed at a location nearest to the semiconductor switching element 102a which is driven by the driver 103a. Furthermore, the driver 103a is an active element that has the shortest connecting distance with the semiconductor switching element 102a.

In the present embodiment, unlike in the case of Embodiment 1, the semiconductor switching element 102a has a main body portion 6 of rectangular plate shape and leads 21 which are bent after extending from a side face of the main body portion 6. The lead 21 is inserted, from the first face 31 side, into a through hole 14 which penetrates the circuit board 1, and is attached to the circuit board 1. The main body portion 6 extends in a direction parallel with the first face 31, keeping a space from the first face 31. The cooling device 4 is attached to a face which is an opposite side face of the first face 31 side face of the main body portion 6.

According to these configurations, since the main body portion 6 extends in a direction parallel with the first face 31, keeping a space from the first face 31, the cooling device 4 can be attached to a face which is an opposite side face of the first face 31 side face of the main body portion 6. Accordingly, in the case where a packaged semiconductor switching element 102a with leads 21 is employed, the cooling device 4 can be disposed on the first face 31 side of the circuit board 1. The physical interference between the cooling device 4 and the driver 103a which is surface mounted to the second face 32 is avoided; the driver 103a is disposed very close to the leads 21 of the semiconductor switching element 102a which is attached to the circuit board 1; and a connecting distance between the driver 103a and the semiconductor switching element 102a can be shorten. Further, since the main body portion 6 is disposed between the cooling device 4 and the circuit board 1, and the cooling device 4 can be disposed apart from the circuit board 1, an electrical insulation between the cooling device 4 and the circuit board 1 can be secured, and an insulation distance between the cooling device 4 and the driver 103a which is disposed on the opposite side of the circuit board 1 can be secured.

Between the mounting surface of the cooling device 4 and the cooling surface of the semiconductor switching element 102a, an insulation sheet 3 is inserted as an insulating member. A screw 7 is inserted into a through hole which is provided in the main body portion 6 from the opposite side of the cooling device 4, and is screwed together with a female screw portion which is provided in the cooling device 4; then the cooling device 4 is fixed to the semiconductor switching element 102a. A through hole 15 is provided in the circuit board 1, either for avoiding the contact of the screw 7 and the circuit board 1, or for attaching the screw 7 from the second face 32 side. The screw 7 may be away from the circuit board 1, and the through hole 15 may not be provided.

Like in the case of Embodiment 3, three leads 21 of a gate terminal, a source terminal, and a drain terminal are provided, and three through holes 14 are also provided. Each of the leads 21 is bent at a right angle and a face of the main body portion 6 is disposed in parallel with the first face 31. The leads 21 of the gate terminal and the source terminal are connected to the terminals of the driver 103a via two connection patterns 12 which are provided on the second face 32. The leads 21 of the source terminal and the drain terminal are connected to circuit patterns which are provided in the circuit board 1 and not shown in the drawing.

The driver 103a is disposed on the side where the main body portion 6 is disposed, with respect to an attaching portion of the lead 21 which is attached to the circuit board 1, and the driver 103a is disposed so that at least its portion overlaps with the cooling device 4, when viewed in the normal directions of the first face 31 and the second face 32 of the circuit board 1. It is possible to compactly arrange respective components of the switching device driving unit 30 and to reduce the size of the unit.

As mentioned above, the semiconductor switching element 102a is a package with leads 21. Even in the case where the semiconductor switching element employs a short lead 21 and needs to be surface mounted on the circuit board 1, a connecting distance between the semiconductor switching element 102a and the driver 103a can be shorten, and a stable fast switching can be realized, while securing an electrical insulation between the driver 103a and the cooling device 4, without sacrificing the cooling performance in the semiconductor switching element 102a which is composed of wideband gap semiconductor.

Other Embodiments

Lastly, other embodiments of the present disclosure will be explained. Each of the configurations of embodiments to be explained below is not limited to be separately utilized but can be utilized in combination with the configurations of other embodiments as long as no discrepancy occurs.

(1) In each of the above mentioned embodiments, there has been explained an exemplary case in which the insulating elements 111a to 111d are elements which are different from the drivers 103a to 103d. However, the drivers 103a to 103d may employ insulating drivers which are provided with the insulating elements 111a to 111d.

In this case, in the case where the insulation between the control circuit 109 which is connected to the insulating elements 111a to 111d, and the cooling device 4 is not secured, since the input terminals, of the insulating elements 111a to 111d provided in the drivers 103a to 103d, which are connected to the control circuit 109 are indirectly connected to the cooling device 4 via the case, the control circuit 109 and the like, the input terminals may not be electrically insulated from the cooling device 4. However, parts other than the input terminals of the drivers 103a to 103d are insulated from the cooling device 4.

(2) In each of the above mentioned embodiments, there has been explained an exemplary case in which one driver drives one semiconductor switching element. However, one driver may drive a plurality of semiconductor switching elements. For example, one driver may drive two semiconductor switching elements which are in parallel connection, and also one driver may drive two semiconductor switching elements (102a and 102b, or 102c and 102d in FIG. 2) which are in series connection. In this case, the one switching device driving unit 30 is provided with one driver, a plurality of semiconductor switching elements which are driven by the one driver, and a single or a plurality of cooling devices which cool the plurality of semiconductor switching elements. The arrangement of these the driver, the semiconductor switching elements, and the cooling device will become a configuration which is based on a technical idea similar to the above mentioned embodiments.

In more concrete words, the one driver is surface mounted on the second face, which is an opposite side face of the first face of the circuit board on the side where a single or a plurality of cooling devices are disposed; and the one driver is an active element which is disposed at a location nearest to the plurality of semiconductor switching elements which is driven by the one driver. Further, the one driver is disposed so that at least its portion overlaps with a single or a plurality of cooling devices, when viewed in the normal directions of the first face and the second face of the circuit board. Corresponding to Embodiment 1, each of the plurality of semiconductor switching elements is surface mounted on a first face, and has a cooling surface on an opposite side face of the face which is surface mounted to the circuit board. A single or a plurality of cooling devices are attached to the cooling surface of a plurality of semiconductor switching elements, and heat of the plurality of semiconductor switching elements is transferred to the single or the plurality of cooling devices, without passing through the circuit board. Corresponding to Embodiment 2, each of the plurality of semiconductor switching elements is surface mounted to the second face, and has a cooling pad on a face which is surface mounted to the circuit board. A single or a plurality of cooling devices are attached to a region of the first face, which is an opposite side region of a region of the second face where the plurality of semiconductor switching elements are surface mounted; and heat of the plurality of the semiconductor switching elements is transferred to the single or the plurality of cooling devices via the circuit board.

Corresponding to Embodiment 3, each of the plurality of semiconductor switching elements has a plate like main body portion, and leads which extend from a side face of the main body portion in a linear fashion. Each of the leads is inserted from the first face side into a through hole which penetrates the circuit board, and is attached to the circuit board. Moreover, each of the main body portions extends in a normal direction of the first face, at the first face side of the circuit board, and a single or a plurality of cooling devices are attached to one side cooling surfaces of the respective main body portions. Corresponding to Embodiment. 4, each of the plurality of semiconductor switching elements has a plate like main body portion, and leads which are bent after extending from a side face of the main body portion. Each of the leads is inserted from the first face side into a through hole which penetrates the circuit board, and is attached to the circuit board. Each of the main body portions extends in a direction parallel with the first face, keeping a space from the first face, and a single or a plurality of cooling devices are attached to the opposite side faces of the first side faces of the main body portions, respectively.

(3) In each of the above mentioned embodiments, there has been explained an exemplary case in which the electric power converter employs a full bridge DC-DC converter of insulated type, as shown in FIG. 2. However, the electric power converter may employ any types of electric power converters, as long as the electric power converter is provided with a switching device driving unit. For example, the electric power converter may employ DC—DC converters, of LLC method, half bridge type, or the like, as long as the main circuit in those converters is insulated. Furthermore, the electric power converter may employ AC-DC converters, such as a semi bridgeless AC-DC converter, a totem pole type AC-DC converter, and an inverter which drives a motor, or the like.

(4) In each of the above mentioned embodiments, there has been explained an exemplary case in which the semiconductor switching device 102a and the driver 103a are directly connected with wirings such as a lead and a circuit pattern. However, passive elements, such as a resistance, a capacitor, and a ferrite bead, may be inserted into the connection path between the semiconductor switching device 102a and the driver 103a. The ferrite bead works as inductors, such as a coil which is disposed so as to surround wirings. The ferrite bead is a passive element which eliminates noise components, and can employ a chip type.

The present disclosure can combine freely each of the embodiments within the scope of the disclosure, or each of the embodiments can be modified and eliminated, at proper times.

REFERENCE SIGNS LIST

Circuit Board; 3 Insulating Member; 4 Cooling Device; 6 Main Body Portion; 21 Lead; 22 Contact Terminal; 30 Switching Device Driving Unit; 31 First Face; 32 Second Face; 102*a* Semiconductor Switching Element; 103*a* Driver

What is claimed is:

1. A switching device driving unit comprising:
   a circuit board which has a circuit pattern;
   a semiconductor switching element which is connected with the circuit board and is composed of wideband gap semiconductor;
   a cooling device which cools the semiconductor switching element and is electrically insulated from the semiconductor switching element; and
   a driver which drives the semiconductor switching element,
   wherein the driver is surface mounted on a second face of the circuit board, which opposes a first face of the circuit board on which the cooling device is disposed,
   wherein the semiconductor switching element is surface mounted on the first face, and has a cooling surface on an opposite side face of a face which is surface mounted to the circuit board, and
   the cooling device is attached to the cooling surface of the semiconductor switching element, and
   heat of the semiconductor switching element is transferred to the cooling device without passing through the circuit board,
   wherein the circuit board has a through hole, which penetrates a region of the circuit board where the semiconductor switching element is surface mounted and is embedded with a conductor,
   wherein the semiconductor switching element is formed in a plate like shape and one side face of the semiconductor switching element is surface mounted on the second face,
   wherein the first face side of the through hole is connected to a terminal, which is provided in a surface mounting face of the semiconductor switching element, and the second face side of the through hole is connected to a terminal of the driver via a connection pattern provided in the second face.

2. The switching device driving unit according to claim 1, wherein the driver is an active element that is disposed at a location nearest to the semiconductor switching element which the driver derives.

3. The switching device driving unit according to claim 1, wherein the driver is an active element that has a shortest connecting distance with the semiconductor switching element which the driver derives.

4. The switching device driving unit according to claim 1, wherein the driver is disposed so that at least a portion of the driver overlaps with the cooling device, when viewed in normal directions of the first face and the second face of the circuit board.

5. The switching device driving unit according to claim 1, wherein an insulating member is provided between the cooling device and the semiconductor switching element.

6. The switching device driving unit according to claim 1, wherein the driver drives a plurality of semiconductor switching elements.

7. The switching device driving unit according to claim 6, wherein the driver drives two semiconductor switching elements, which are in series connection and constitute a half bridge.

8. The switching device driving unit according to claim 1, wherein the wideband gap semiconductor employs GaN which is Gallium Nitride.

9. The switching device driving unit according to claim 1, wherein the driver is surface mounted in a region of the second surface which is adjacent to an opposite side region of a region of the first face where the semiconductor switching element is surface mounted,
wherein the through hole is provided at the driver side end portion of a region of the circuit board where the semiconductor switching element is surface mounted.

10. A switching device driving unit comprising:
a circuit board which has a circuit pattern;
a semiconductor switching element which is connected with the circuit board and is composed of wideband gap semiconductor;
a cooling device which cools the semiconductor switching element and is electrically insulated from the semiconductor switching element; and
a driver which drives the semiconductor switching element,
wherein the driver is surface mounted on a second face of the circuit board, which opposes a first face of the circuit board on which the cooling device is disposed, and is electrically insulated from the cooling device,
wherein the semiconductor switching element has a main body portion of plate like shape and a lead which extends in a linear fashion from a side face of the main body portion, and
the lead is inserted from the first face side into a through hole which penetrates the circuit board, and is attached to the circuit board, and
the main body portion extends in a normal direction of the first face, at the first face side of the circuit board, and
the cooling device is attached to one side cooling surface of the main body portion,
a protruding portion of the lead which protrudes from the through hole to the second face side is connected to a terminal of the driver via a connection pattern provided in the second face.

11. The switching device driving unit according to claim 10, wherein the cooling device is disposed apart from the first face, and is electrically insulated from the circuit board.

12. A switching device driving unit comprising:
a circuit board which has a circuit pattern;
a semiconductor switching element which is connected with the circuit board and is composed of wideband gap semiconductor;
a cooling device which cools the semiconductor switching element and is electrically insulated from the semiconductor switching element; and
a driver which drives the semiconductor switching element,
wherein the driver is surface mounted on a second face of the circuit board, which opposes a first face of the circuit board on which the cooling device is disposed,
wherein the semiconductor switching element has a main body portion of plate like shape, and a lead which is bent after extending from a side face of the main body portion, and
the lead is inserted from the first face side into a through hole which penetrates the circuit board, and is attached to the circuit board, and
the main body portion extends in a direction parallel with the first face, keeping a space from the first face, and
the cooling device is attached to a face, which is an opposite side face of the first face side face of the main body portion,
a protruding portion of the lead which protrudes from the through hole to the second face side is connected to a terminal of the driver via a connection pattern provided in the second face.

* * * * *